(12) United States Patent
Oh

(10) Patent No.: US 7,015,531 B2
(45) Date of Patent: Mar. 21, 2006

(54) FERAM HAVING BOTTOM ELECTRODE CONNECTED TO STORAGE NODE AND METHOD FOR FORMING THE SAME

(75) Inventor: Sang-Hyun Oh, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 09/949,083

(22) Filed: Sep. 10, 2001

(65) Prior Publication Data

US 2002/0125523 A1 Sep. 12, 2002

(30) Foreign Application Priority Data

Mar. 7, 2001 (KR) ................................ 2001-11659

(51) Int. Cl.
*H01L 29/76* (2006.01)
(52) U.S. Cl. .................. 257/310; 257/306; 257/307; 257/308; 257/309; 257/750; 257/751; 257/752; 438/244; 438/253; 438/627
(58) Field of Classification Search ............... 257/310, 257/295, 296, 769, 773, 238, 239, 306, 307, 257/308, 309, 750, 751, 752; 438/238, 244, 438/424, 253, 627
See application file for complete search history.

(56) References Cited

U.S. PATENT DOCUMENTS

| 5,536,672 A | 7/1996 | Miller et al. |
| 5,561,307 A * | 10/1996 | Mihara et al. ............... 257/295 |
| 5,627,391 A * | 5/1997 | Shimada et al. ............. 257/310 |
| 5,696,018 A | 12/1997 | Summerfelt et al. |
| 5,729,054 A | 3/1998 | Summerfelt et al. |

(Continued)

FOREIGN PATENT DOCUMENTS

| JP | 11-307731 | 11/1999 |
| JP | 2000-031403 | 1/2000 |
| JP | 2000-164817 | 6/2000 |
| JP | 2000174215 | 6/2000 |

*Primary Examiner*—Nathan J. Flynn
*Assistant Examiner*—Fazli Erdem
(74) *Attorney, Agent, or Firm*—Mayer, Brown, Rowe & Maw LLP

(57) ABSTRACT

A FeRAM device in which a bottom electrode of a ferroelectric capacitor is connected to a source/drain region of a transistor and a top electrode is connected to a plate line. The FeRAM device comprises a semiconductor substrate; a gate electrode formed on the semiconductor substrate; an impurity region formed on each side of the gate electrode of the semiconductor substrate; a bottom electrode connected to the impurity region; an oxygen diffusion barrier layer formed on the bottom electrode; a ferroelectric layer formed on the oxygen diffusion barrier layer and the bottom electrode; and a top electrode formed on the ferroelectric layer.

7 Claims, 19 Drawing Sheets

U.S. PATENT DOCUMENTS

| | | | |
|---|---|---|---|
| 5,744,832 A * | 4/1998 | Wolters et al. | 257/295 |
| 5,837,591 A * | 11/1998 | Shimada et al. | 438/381 |
| 5,976,928 A * | 11/1999 | Kirlin et al. | 438/240 |
| 6,051,858 A * | 4/2000 | Uchida et al. | 257/295 |
| 6,066,528 A * | 5/2000 | Fazan et al. | 438/253 |
| 6,072,689 A * | 6/2000 | Kirlin | 361/311 |
| 6,136,659 A * | 10/2000 | Schindler et al. | 438/386 |
| 6,146,963 A * | 11/2000 | Yu | 438/396 |
| 6,180,970 B1 * | 1/2001 | Hwang et al. | 257/295 |
| 6,204,146 B1 * | 3/2001 | Jenq | 438/424 |
| 6,218,258 B1 * | 4/2001 | Joo | 438/396 |
| 6,291,250 B1 * | 9/2001 | Igarashi | 438/3 |
| 6,407,422 B1 * | 6/2002 | Asano et al. | 257/306 |
| 2001/0012698 A1 * | 8/2001 | Hayashi et al. | 438/782 |
| 2002/0017723 A1 * | 2/2002 | Igarashi | 257/751 |

* cited by examiner

FERAM HAVING BOTTOM ELECTRODE CONNECTED TO STORAGE NODE AND METHOD FOR FORMING THE SAME

FIELD OF THE INVENTION

The present invention relates to a method for manufacturing ferroelectric memory devices and, more particularly, to a method for manufacturing ferroelectric memory devices having bottom electrodes connected to charge storage nodes.

DESCRIPTION OF THE PRIOR ART

A ferroelectric random access memory (FeRAM) is a nonvolatile semiconductor memory device with a high integrated dynamic random access memory (DRAM), the speedy information processing of a static random access memory (SRAM), and the information storing function of a flash memory. As compared with a conventional flash memory and an electrically erasable programmable read only memory (EEPROM), it has a relatively low operational voltage and an operation speed that is about 1000 times faster.

When a voltage is applied to a DRAM capacitor, which includes a dielectric layer such as a $SiO_2$ layer or a SiON layer, and the power supply is terminated, the capacitor is discharged so that data stored in the DRAM are lost.

The ferroelectric material has two stabilized remnant polarization states, therefore being different from the DRAM capacitor. The ferroelectric capacitor in the FeRAM maintains previously stored data by the remnant polarization of the ferroelectric material even if the power supply is terminated.

FIG. 1 is a circuit diagram illustrating a memory cell structure of a conventional FeRAM device including one transistor and one ferroelectric capacitor.

The transistor (Tr) includes a gate electrode connected to a word line (WL), a source and a drain, which are respectively connected to a bit line (BL) and a capacitor (C). The capacitor (C) includes a first electrode connected to a plate line (PL), a second electrode connected to the transistor (Tr) and a ferroelectric layer formed between the first electrode and the second electrode. The second electrode of the capacitor (C) functions as a charge storage electrode.

The FeRAM device is similar to the DRAM device in that a capacitor and a transistor are connected to a word line and a plate line, respectively. However, the FeRAM device is different from the DRAM device in that the capacitor has a ferroelectric layer and the plate line is not connected to a ground voltage or a fixed voltage, e.g., 1/2 Vcc, and each cell is connected to a separate plate line so that power can be applied to the separate plate line on a cell-by-cell basis.

FIG. 2 is a graph showing a hysteresis loop of a ferroelectric capacitor in a FeRAM device. In FIG. 2, a positive voltage is defined when the potential of the plate line is higher than that of the bit line and remnant quantity of charges at points, "a" and "c", are defined to data "1" and "0", respectively.

If the transistor is turned on and a negative voltage is applied to the plate line (PL), then a negative voltage is also applied to the ferroelectric capacitor and a charge variation passes through point "d" in the hysteresis loop.

After that, in case of turning the applied voltage to "0 V", a polarization value goes to point "a" and the data "1" is stored. Meanwhile, a positive voltage is applied to the ferroelectric capacitor and the charge variation passes through point "b", turning the applied voltage to "0 V", with a polarization value going to point "c" and data "0" being stored.

When the voltage is applied to the ferroelectric capacitor, a data reading process is carried out by detecting a voltage variation on the bit line. That is, if a positive voltage is applied to the capacitor, in case the data is "0", the charge variation of $\Delta Q_0$ is detected. That is, the charge variation on the bit line is determined by information stored on the capacitor.

The charge variation due to the remnant polarization of the ferroelectric capacitor changes a voltage level on the bit line. Typically, parasite capacitance "Cb" exists on the bit line itself. When the transistor is turned on and a memory to be read out is selected, charges of as much as $\Delta Q_1$ or $\Delta Q_0$ are outputted. Bit line voltages "V1" and "V0" are acquired by dividing the $\Delta Q_1$ and the $\Delta Q_0$ with the sum of bit line capacitance (Cb) and ferroelectric capacitor (C) capacitance "Cs" and is given by:

$$V1 = \Delta Q_1/(Cb+Cs)$$

$$V0 = \Delta Q_0/(Cb+Cs)$$

Therefore, the potential on the bit line is varied according to the difference between the data "1" and "0". When the transistor is turned on by applying a voltage to the word line, the potential on the bit line is changed to the "V1" or the "V0". In order to determine whether potential on the bit line is in a voltage level of "V1" or "v0", a reference voltage (Vref), which is set to a specific voltage level between the voltage levels "V1" and "V0", is used.

$SrBi_2Ta_2O_9$ (hereinafter, referred to as a SBT) or $Pb(Zr, Ti)O_3$ (hereinafter, referred to as a PZT) thin layer is mainly used as a dielectric material in the FeRAM. The material property of the bottom layer disposed under a ferroelectric layer is important to crystallize the ferroelectric layer. That is, in the ferroelectric capacitor, the electrode is affected by the characteristics of the ferrolectric layer, so there is a requirement for sufficiently low resistance, a small lattice mismatch between the ferroelectric material and the electrode, a high heat-resistance, a low reactivity, a high diffusion barrier characteristic and a good adhesion between the electrode and the ferroelectric material.

Especially, the ferroelectric memory device manufacturing process incorporates a high thermal process, so a polysilicon layer cannot be used as an electrode in the DRAM device. That is, the polysilicon layer may be oxidized in forming a ferroelectric layer, such as the SBT, or in other thermal processes.

Therefore, in a conventional method, a metal layer is used as an interconnection layer in the FeRAM device, connecting a top electrode of the ferroelectric capacitor to a metal oxide semiconductor field effect transistor (MOSFET).

FIG. 3 is a cross-sectional view showing a conventional FeRAM device. A field oxide layer 11 is formed in a semiconductor substrate 10, and a MOS transistor having a gate insulating layer 12, a gate electrode 13 and a source/drain 14 is formed in the semiconductor substrate 10. A first interlayer insulating layer 15 is formed on the semiconductor substrate 10 and an adhesion layer 16 is formed on the first interlayer insulating layer 15. A capacitor, which comprises a bottom electrode 17, a ferroelectric layer 18 and a top electrode 19, is formed on the adhesion layer 16. A second interlayer insulating layer 20 that covers the capacitor is formed on the resulting structure. Then, a first contact hole and a second contact hole that respectively expose the top electrode 19 of the capacitor and the source/drain 14 are formed. Subsequently, a metal diffusion barrier layer 21, which is made by the stacked structure of a Ti layer and a TiN layer, is formed, followed by an interconnection line 22 between the capacitor and the transistor.

As described above, the conventional FeRAM device manufacturing method requires a predetermined interval A between the bottom electrode 17 and the second contact hole in order to prevent an electric short between the top electrode 19 and the bottom electrode 17 of the capacitor. Because of this, the device occupies unnecessary space in a cell and is a restriction in minimizing the cell size. Also, in forming the interconnection line 22, exposing and etching processes are unstable and a topology between a memory cell area and a periphery circuit area is increased due to the capacitor formation. With the increased integration in memory devices, the increading height of the device, and the increased thickness of the first interlayer insulating layer 15 and the second interlayer insulating layer 20, it is difficult to fill the second contact hole exposing the source/drain 14 with a metal layer.

SUMMARY OF THE INVENTION

It is, therefore, an object of the present invention to provide a ferroelectric memory device, which is capable of connecting a bottom electrode to a charge storage node so as to increase device integration, and make processing easy.

In accordance with one aspect of the present invention, there is provided a memory device comprising a semiconductor substrate; a gate electrode formed on the semiconductor substrate; impurity regions formed in the semiconductor-substrate adjacent to each side of the gate electrode; a bottom electrode of a capacitor connected to one of the impurity regions; an oxygen diffusion barrier layer formed on the bottom electrode; a ferroelectric layer formed on the oxygen diffusion barrier layer and the bottom electrode; and a top electrode formed on the ferroelectric layer.

In accordance with another aspect of the present invention, there is provided a memory device comprising a semiconductor substrate; a gate electrode formed on the semiconductor substrate; impurity regions formed in the semiconductor substrate adjacent to the side of the gate electrode; a metal diffusion barrier layer formed on the impurity region; a oxygen diffusion barrier layer formed on the metal diffusion barrier layer; a bottom electrode formed on the oxygen diffusion barrier layer and the metal diffusion barrier layer; a ferroelectric layer formed on the bottom electrode; and a top electrode formed on the ferroelectric layer.

In accordance with a further aspect of the present invention, there is provided a memory device manufacturing method, comprising steps of a) forming an interlayer insulating layer on a semiconductor substrate having a transistor, including a gate oxide layer, a gate electrode and impurity regions; b) forming a contact hole exposing one of the impurity regions by selectively etching the interlayer insulating layer; c) forming a bottom electrode of a semiconduct capacitor in and around the contact hole, wherein the bottom electrode is connected to the impurity region within the contact hole; d) forming an oxygen diffusion barrier layer on the bottom electrode within the contact hole; e) forming a ferroelectric layer on the oxygen diffusion barrier layer and the bottom electrode; and f) forming a top electrode on the ferroelectric layer.

In accordance with still another aspect of the present invention, there is provided a memory device manufacturing method, comprising steps of: a) forming an interlayer insulating layer on a semiconductor substrate having a transistor, including a gate oxide layer, electrode and impurity regions; b) forming a contact hole exposing one of the impurity regions by selectively etching the interlayer insulating layer; c) forming a metal diffusion barrier layer in and around the contact hole, wherein the metal diffusion barrier layer is connected to the impurity region within the contact hole; d) forming an oxygen diffusion barrier layer on the metal diffusion barrier layer within the contact hole; e) forming a bottom electrode on the oxygen diffusion barrier layer and the metal diffusion barrier layer; f) forming a ferroelectric layer on the bottom electrode; and g) forming a top electrode on the ferroelectric layer.

The FeRAM device in accordance with the present invention includes a gate insulating layer and a gate electrode formed on a semiconductor substrate, a transistor having an impurity region formed within the semiconductor substrate of each side of the gate electrode, an interlayer insulating layer which covers an upper part of the semiconductor substrate that completes a bottom structure formation, including the transistor, a contact hole which exposes an impurity region of a transistor and is formed within the interlayer insulating layer, a metal diffusion barrier layer connected to the impurity region through the contact hole, a bottom electrode formed on the metal diffusion barrier layer, a ferroelectric layer which covers the bottom electrode and a top electrode connected to a plate line by forming on the ferroelectric layer, and an oxygen diffusion barrier layer formed within the metal diffusion barrier layer in the contact hole on the bottom electrode.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

Figure 1:
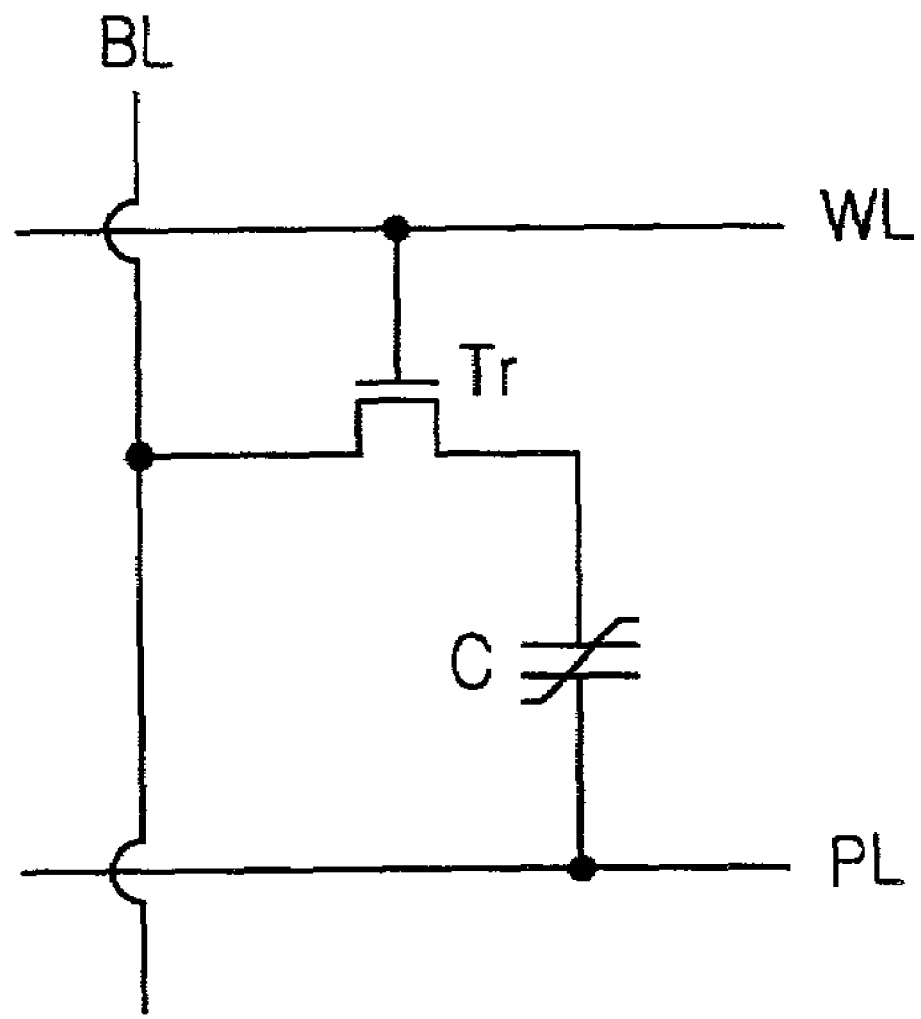
FIG. 1 is a circuit diagram illustrating a memory cell structure of a conventional FeRAM device including one transistor and one ferroelectric capacitor.
Figure 2:
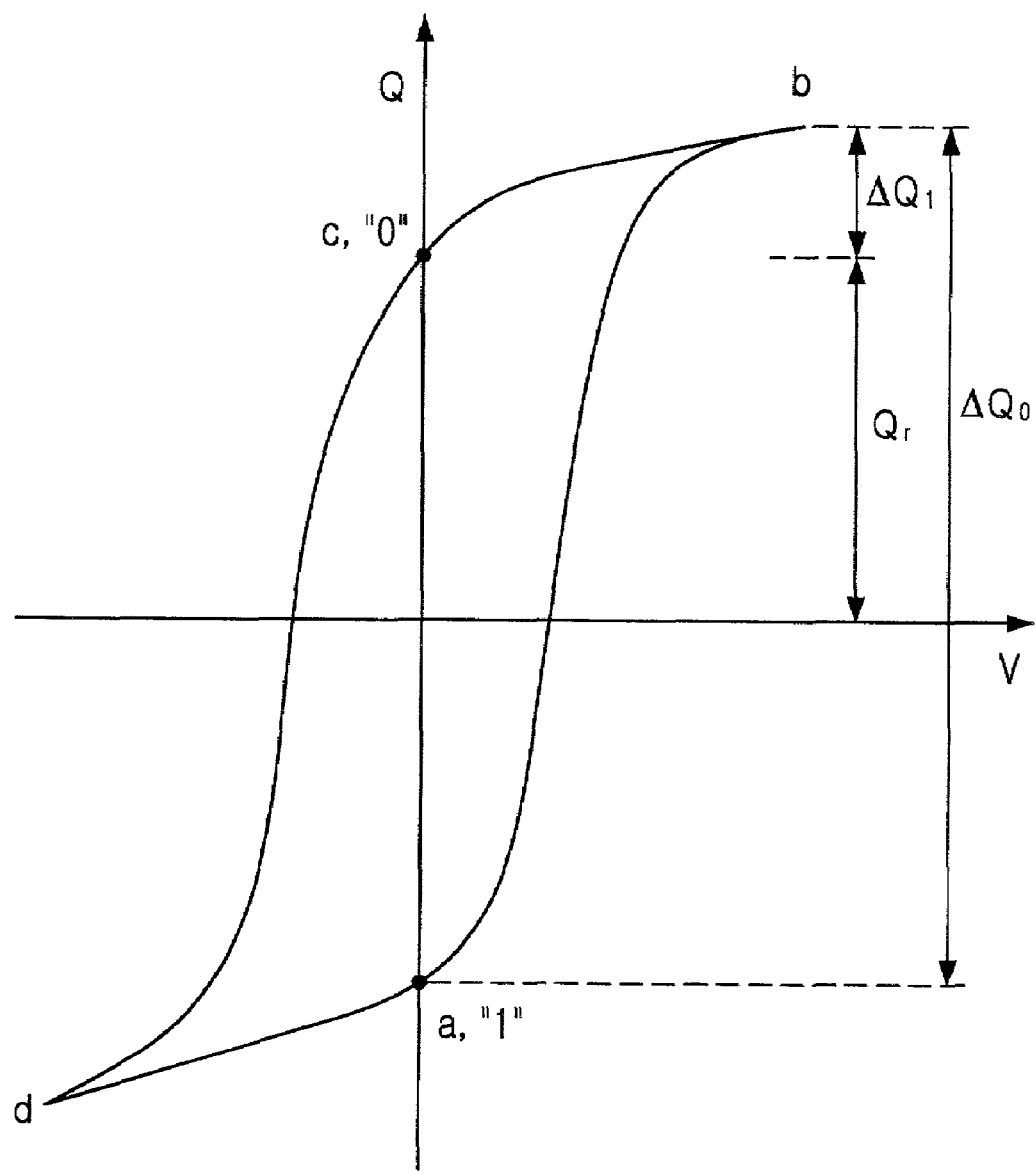
FIG. 2 is a hysteresis loop of a ferroelectric capacitor.
Figure 3:
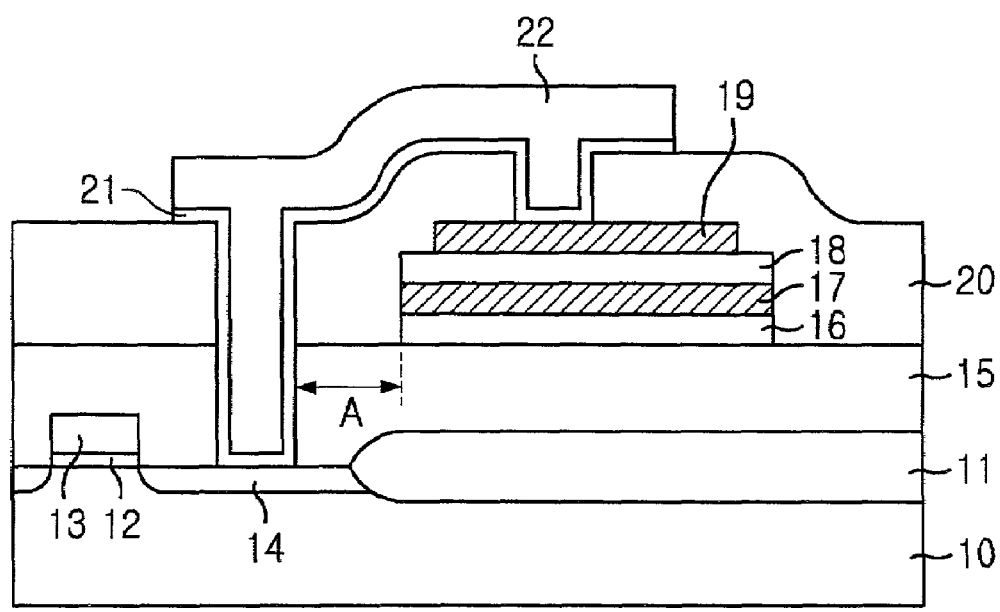
FIG. 3 is a cross-sectional view showing a conventional FeRAM device.

Hereinafter, a FeRAM device according to the present invention will be described in detail referring to the accompanying drawings. In embodiments according to the present invention, the same reference numerals denote the same elements throughout.

Figure 4:
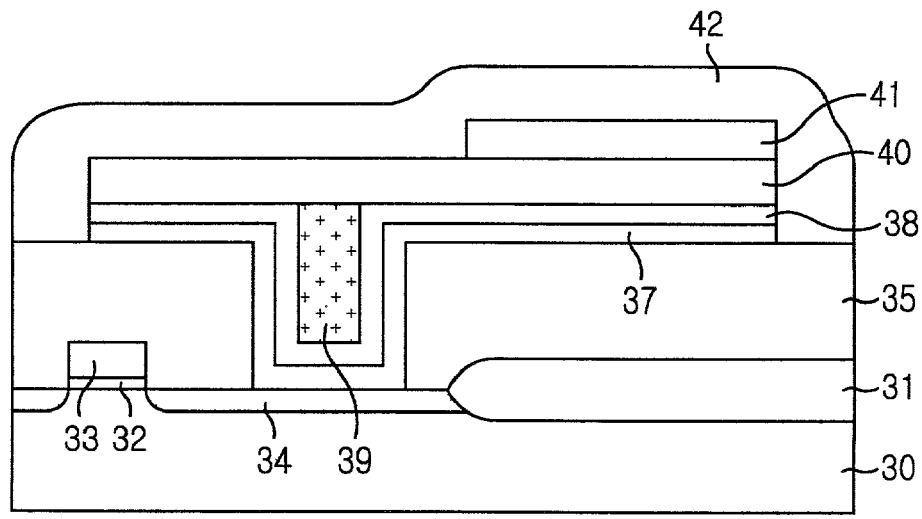
FIG. 4 is a cross-sectional view showing a FeRAM device in accordance with a first embodiment of the present invention.

FIG. 4 is a cross-sectional view showing a FeRAM device in accordance with a first embodiment of the present invention.

A field oxide layer 31 is formed in a semiconductor substrate 30, and a transistor having a gate insulating layer 32, a gate electrode 33, and a source/drain impurity region 34 is formed. A first interlayer insulating layer 35 covers a top portion of the semiconductor substrate 30 where a bottom structure including the field oxide layer 31 and the transistor has been completed. A contact hole exposes the impurity region 34 to be connected with a ferroelectric capacitor, being formed within the first interlayer insulating layer 35. A metal diffusion barrier layer 37 is formed on the source/drain impurity region 34 through the contact hole and covers the first interlayer insulating layer 35 around the contact hole. A bottom electrode 38 of the ferroelectric capacitor is formed on the metal diffusion barrier layer 37 and an oxygen diffusion barrier layer 39 is formed on the bottom electrode 38 within the contact hole. At this time, the oxygen diffusion barrier layer 39 has the same topology as the bottom electrode 38. Then, a ferroelectric layer 40 covers the oxygen diffusion barrier layer 39 and the bottom electrode 38 and a top electrode 41 of the ferroelectric capacitor is formed on the ferroelectric layer 40 and connected with a plate line. Finally, a second interlayer insulating layer 42 covers a resulting structure where the capacitor formation has been completed. The metal diffusion barrier layer 37 may be connected only with the exposed impurity region 34 and sidewalls of the first interlayer insulating layer 35 in the contact hole and, in this case, the bottom electrode 38 may not be in direct contact with the top surface of the first interlayer insulating layer 35.

Figure 5:
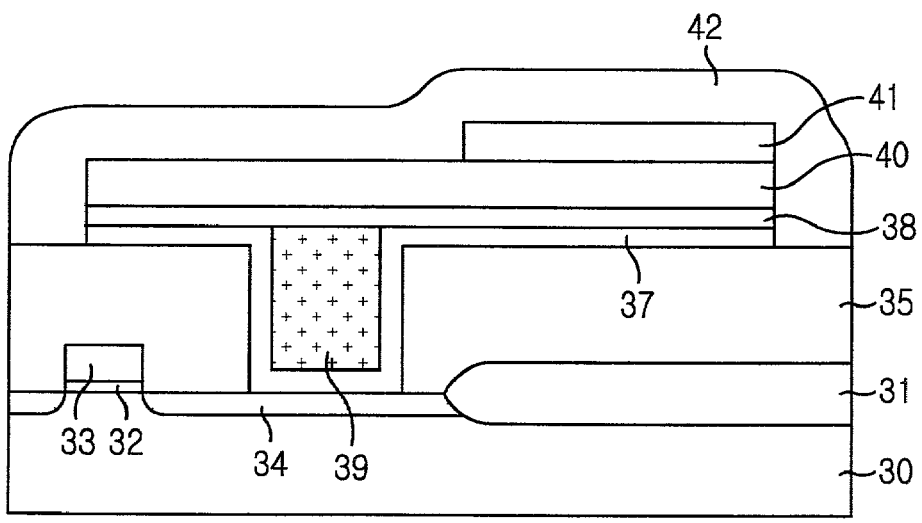
FIG. 5 is a cross-sectional view showing a FeRAM device in accordance with a second embodiment of the present invention.

FIG. 5 is a cross-sectional view showing a FeRAM device in accordance with a second embodiment of the present invention.

A field oxide layer 31 is formed in a semiconductor substrate 30, and a transistor having a gate insulating layer 32, a gate electrode 33 and a source/drain impurity region 34 is formed. A first interlayer insulating layer 35 covers a top portion of the semiconductor substrate 30 where a bottom structure including the field oxide layer 31 and the transistor has been completed. A contact hole exposes the impurity region 34 to be connected with a ferroelectric capacitor. A metal diffusion barrier layer 37 is formed on the impurity region 34 through the contact hole and covers the first interlayer insulating layer 35 around the contact hole. An oxygen diffusion barrier layer 39 is formed on the metal diffusion barrier layer 37 such that the oxygen diffusion barrier layer 39 has the same topology as the metal diffusion barrier layer 37 within the contact hole. Then, a bottom electrode 38 is formed on both the oxygen diffusion barrier layer 39 and the metal diffusion barrier layer 37 around the contact hole, a ferroelectric layer 40 is formed on the bottom electrode 38, and a top electrode 41 is formed on the ferroelectric layer 40. Finally, a second interlayer barrier layer 42 covers the resulting structure where the capacitor formation has been completed.

Figure 6:
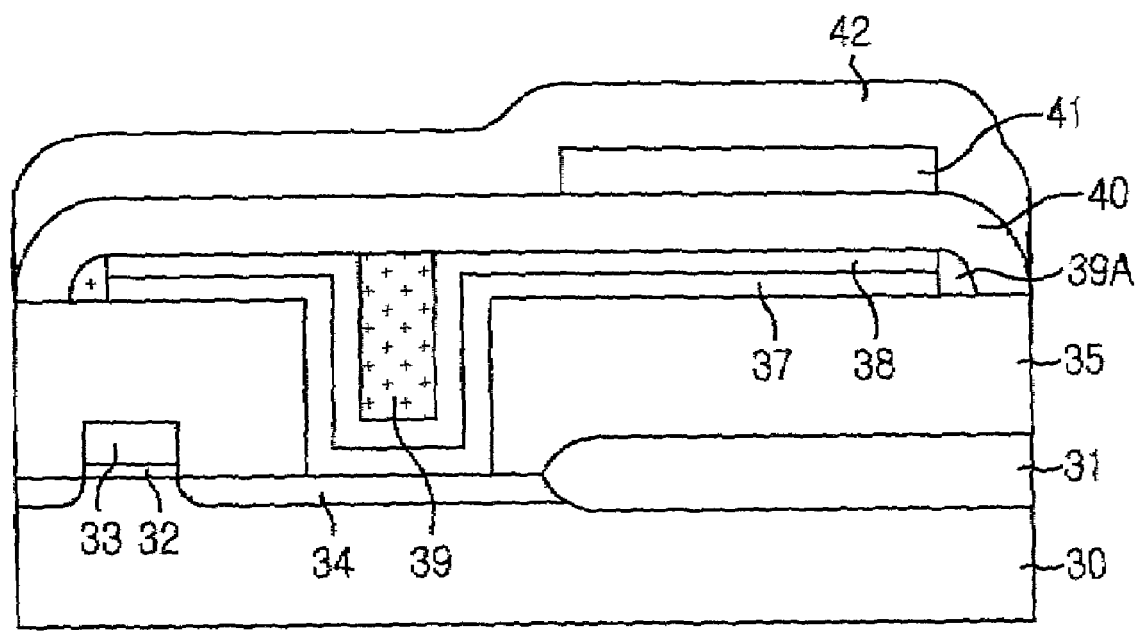
FIG. 6 is a cross-sectional view showing a FeRAM device in accordance with a third embodiment of the present invention.

FIG. 6 is a cross-sectional view showing a FeRAM device in accordance with a third embodiment of the present invention. The device shown in FIG. 6 is similar to the first embodiment shown in FIG. 4.

With the addition of an oxygen diffusion barrier layer spacer 39A being formed on sidewalls of the metal diffusion barrier layer 37 and the bottom electrode 38. Likewise, such an oxygen diffusion barrier layer spacer 39A can be also formed on sidewalls of the metal diffusion barrier layer 37 and the bottom electrode 38 of the second embodiment of the present invention shown in FIG. 5.

Figure 7A:
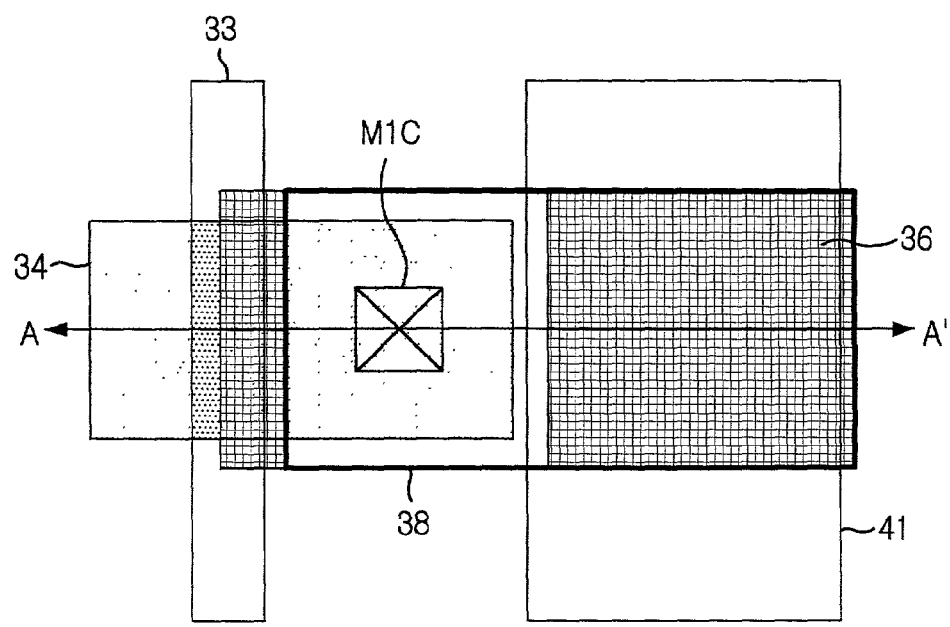
FIG. 7A is a top plan view showing a FeRAM device in accordance with a fourth embodiment of the present invention.
Figure 7B:
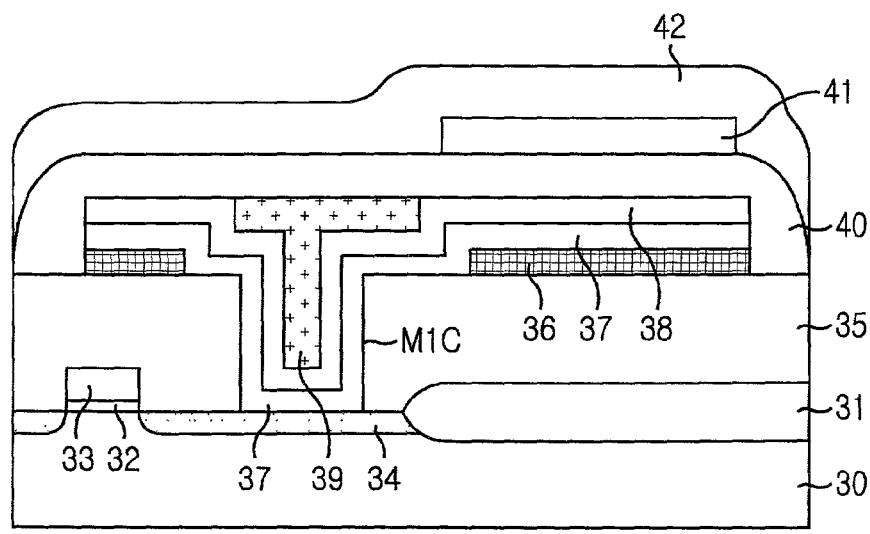
FIG. 7B is a cross-sectional view showing a FeRAM device in accordance with a fourth embodiment of the present invention.

FIGS. 7A and 7B are top plan and cross-sectional views, respectively, showing a FeRAM device in accordance with a fourth embodiment of the present invention.

In FIGS. 7A and 7B, an adhesion layer 36 pattern is further formed between the metal diffusion barrier layer 37 and the first interlayer insulating layer 35 as shown in FIG. 4, so that an adhesion between the first interlayer insulating layer 35, which includes oxygen materials, and the metal diffusion barrier layer 37 is increased. Also, with a topology generated by the formation of the adhesion layer 36, the topology of the metal diffusion barrier layer 37 and the bottom electrode 38 may be increased. In a similar way, the use of the adhesion layer 36 can be applied to the second embodiment shown in FIG. 5.

Figure 8:
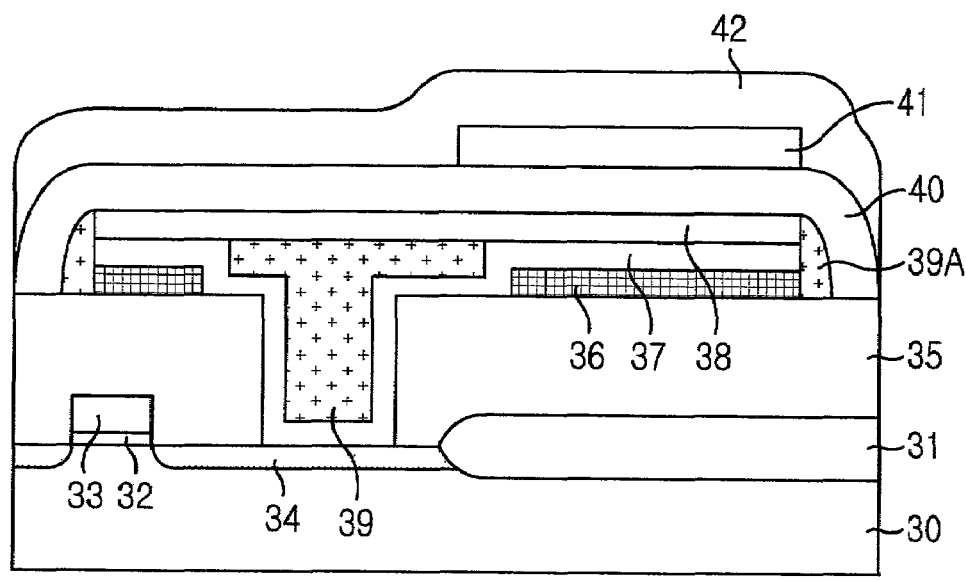
FIG. 8 is a cross-sectional view showing a FeRAM device in accordance with a fifth embodiment of the present invention.

FIG. 8 is a cross-sectional view showing a FeRAM device in accordance with a fifth embodiment of the present invention.

FIG. 8 is different from FIG. 7B in that the oxygen diffusion barrier layer 39 covers the metal diffusion barrier layer 37 within the contact hole and the oxygen diffusion barrier layer spacer 39A is formed. The bottom electrode 38 covers the oxygen diffusion barrier layer 39 and the metal diffusion barrier layer 37 around the contact hole, and the oxygen diffusion barrier spacer 39A is formed on sidewalls of the metal diffusion barrier layer 37, the bottom electrode 38 and the adhesion layer 36.

Figure 9:
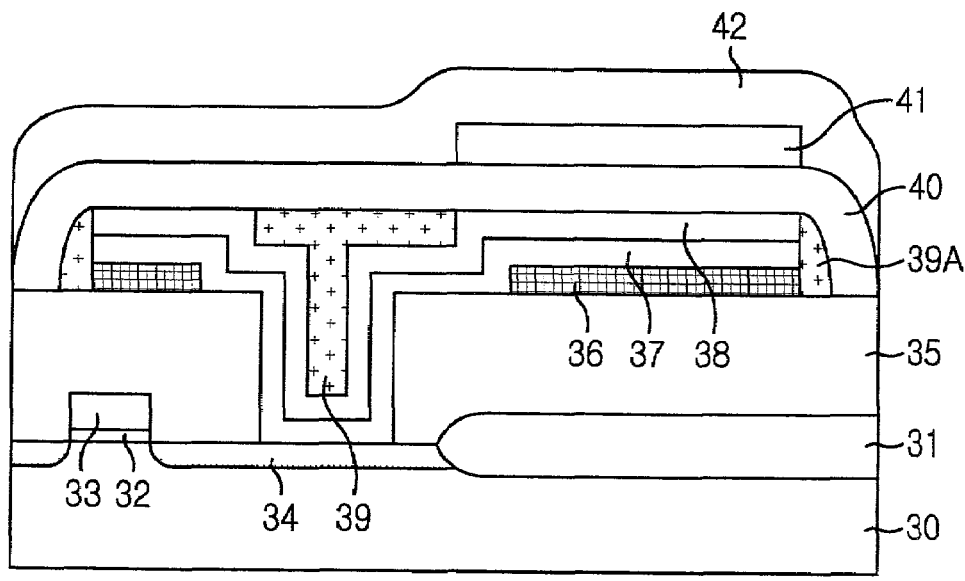
FIG. 9 is a cross-sectional view showing a FeRAM device in accordance with a sixth embodiment of the present invention.

FIG. 9 is a cross-sectional view showing a FeRAM device in accordance with a sixth embodiment of the present invention.

Referring to FIG. 9, the oxygen diffusion barrier spacer 39A is formed on the sidewalls of the adhesion layer 36, the metal diffusion barrier layer 37 and the bottom electrode 38 as in the fourth embodiment in accordance with the present invention shown in FIG. 7B.

In the FeRAM device described in the first through sixth embodiments in accordance with the present invention, the semiconductor substrate 30 is a silicon substrate, and the adhesion layer 36 is made of any one selected from the group consisting of a $TiO_x$ layer, a $IrO_x$ layer and a $Al_2O_3$ layer. The metal diffusion barrier layer 37 is made by stacking up a Ti layer and a TiN layer. At this time, a $TiSi_x$ silicide layer may be further included between the metal diffusion barrier layer 37 and the semiconductor substrate 30 that is composed of a silicon layer. Each of the bottom electrode 38 and the top electrode 41 is composed of any one selected from the group consisting of Pt, Ir, $IrO_x$, Ru, Re and Rh materials. The oxygen diffusion barrier layer 39 and the oxygen diffusion barrier layer spacer 39A are formed with $Si_3N_4$ material. The ferroelectric layer 40 is formed with $SrBi_2O_9$(SBT) or Pb(Zr, Ti)$O_3$(PZT), and may have a perovskite or a layered-super-lattice structure.

Hereinafter, a method for manufacturing the FeRAM device in the first embodiment of the present invention is described in detail referring to FIGS. 10A to 10C.

Figure 10A:
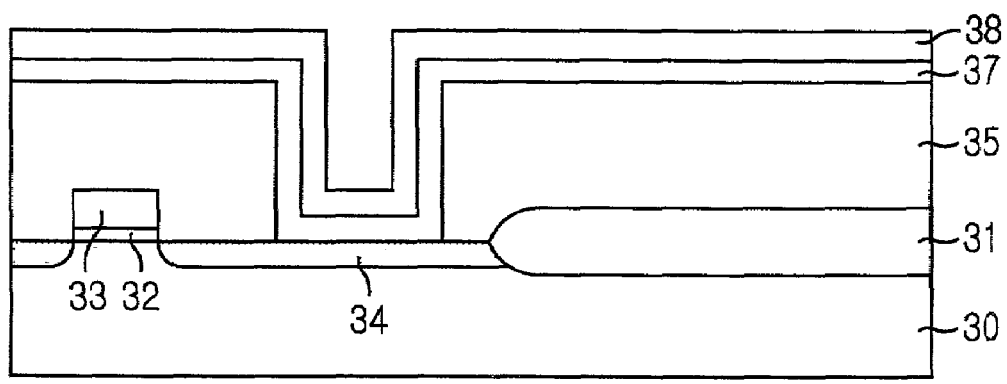
FIGS. 10A to 10C are cross-sectional views showing a FeRAM device manufacturing process in accordance with the first embodiment of the present invention.

First, referring to FIG. 10A, the first interlayer insulating layer 35, which covers the silicon semiconductor substrate 30, is selectively etched to form the contact hole exposing the source/drain impurity region 34, wherein the silicon semiconductor substrate 30 has the transistor structure including the field oxide layer 31, the gate insulating layer 32, the gate electrode 33 and the source/drain impurity region 34. Then, the metal diffusion barrier layer 37 and the bottom electrode 38, which are formed on the bottom and sidewalls of the contact hole and on the first interlayer insulating layer 35, are formed in this order.

Figure 10B:
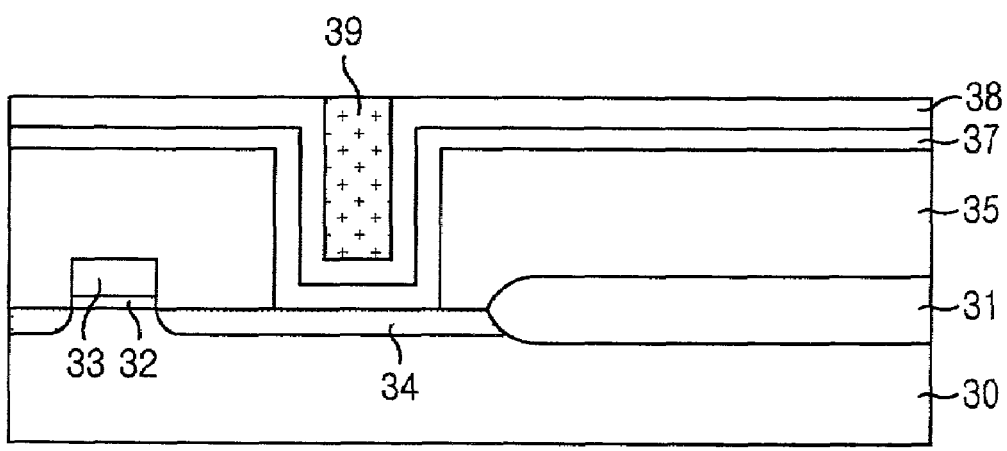

After forming the bottom electrode 38, as shown in FIG. 10B, the oxygen diffusion barrier layer 39 is formed on the bottom electrode 38, filling the contact hole. At this time, in the preferred embodiment of the present invention, the oxygen diffusion barrier layer 39 has the same topology as the bottom electrode 38 over the interlayer insulating layer 35.

Figure 10C:
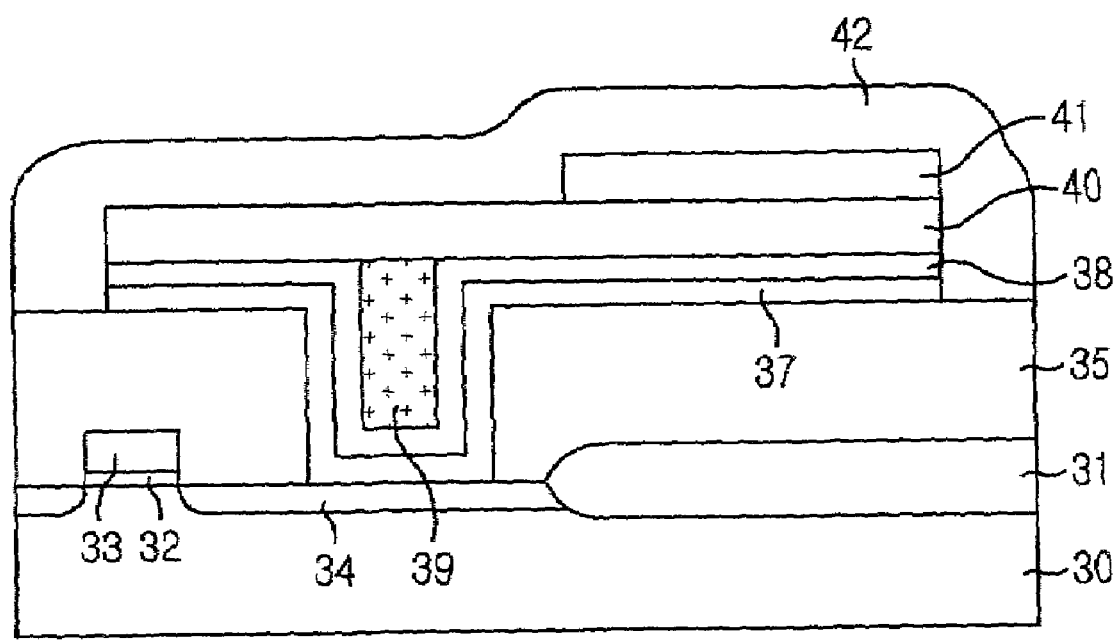

Subsequently, as shown in FIG. 10C, the ferroelectric layer 40 is formed on the bottom electrode 38 and the oxygen diffusion barrier layer 39, and the top electrode 41 is formed on the ferroelectric layer 40. Finally, the second interlayer insulating layer 42 is formed on the resulting structure.

A method for manufacturing the FeRAM device in the second embodiment of the present invention will be described in detail referring to FIGS. 11A to 11C.

Figure 11A:
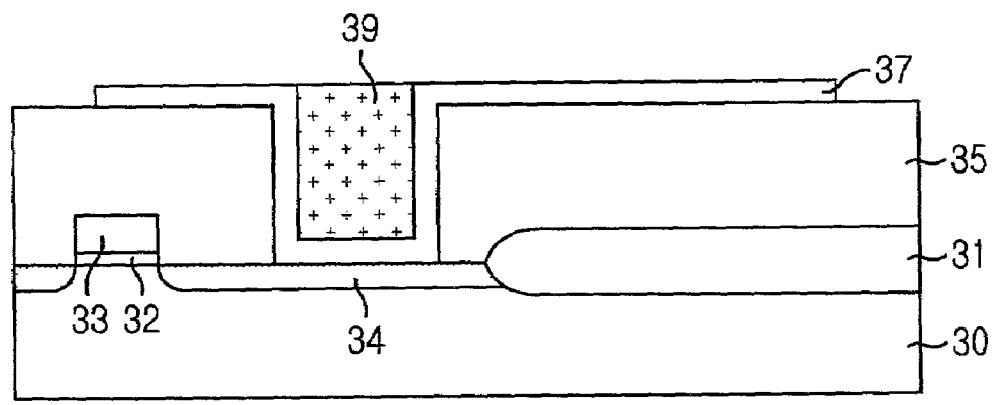
FIGS. 11A to 11C are cross-sectional views showing a FeRAM device manufacturing process in accordance with the second embodiment of the present invention.

First, referring to FIG. 11A, the first interlayer insulating layer 35, which covers the silicon semiconductor substrate 30, is selectively etched to form the contact hole exposing the source/drain impurity region 34, wherein the silicon semiconductor substrate 30 has the transistor structure including the field oxide layer 31, the gate insulating layer 32, the gate electrode 33 and the source/drain impurity region 34. Then, the metal diffusion barrier layer 37 is formed on the bottom and sidewalls of the contact hole and around the first interlayer insulating layer 35. The oxygen diffusion barrier layer 39 is formed on the metal diffusion barrier layer 37 within the contact hole, filling the contact hole. The oxygen diffusion barrier layer 39 has the same topology as the metal diffusion barrier layer 37 over the interlayer insulating layer 35.

Figure 11B:
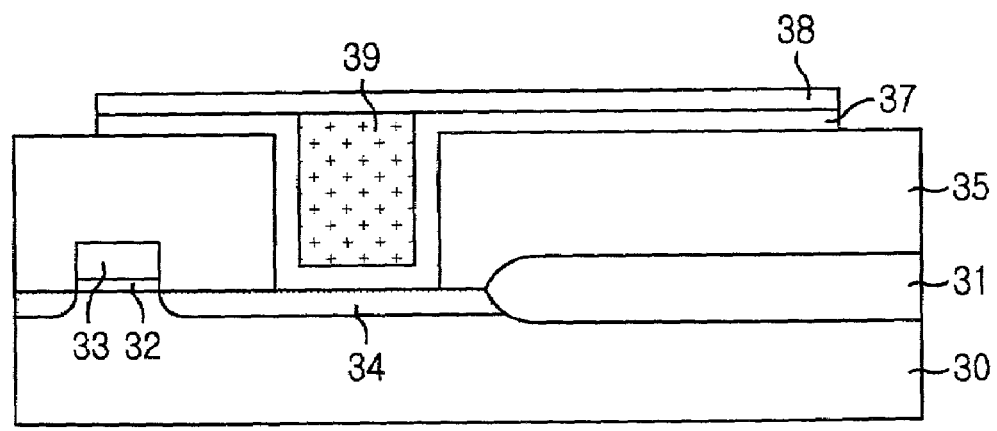

Subsequently, the bottom electrode 38 is formed on the metal diffusion barrier layer 37 and the oxygen diffusion barrier layer 39, as shown in FIG. 11B.

Figure 11C:
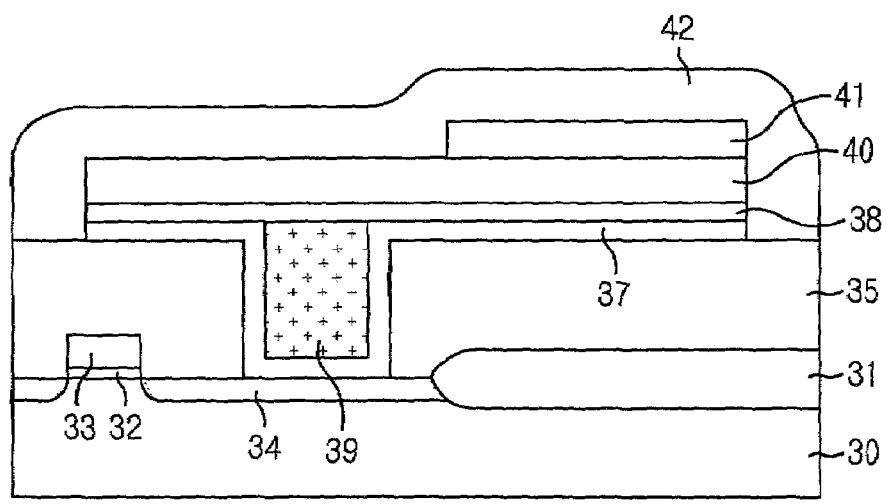

Finally, as shown in FIG. 11C, the ferroelectric layer 40 and the top electrode 41 are, in this order, formed on the bottom electrode 38, and the second interlayer insulating layer 42 is succeedingly formed on the resulting structure.

A method for manufacturing the FeRAM device in accordance with the third embodiment of the present invention will be described in detail referring to FIGS. 12A to 12C.

Figure 12A:
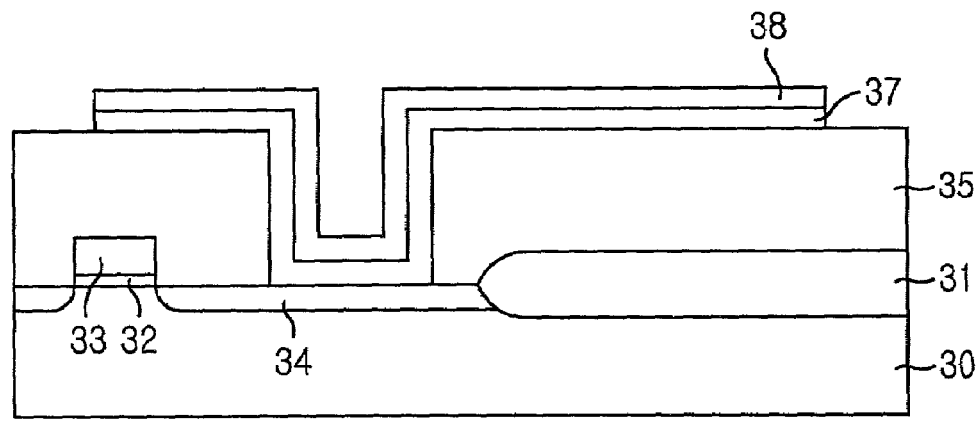
FIGS. 12A to 12C are cross-sectional views showing a FeRAM device manufacturing process in accordance with the third embodiment of the present invention.
Figure 12B:
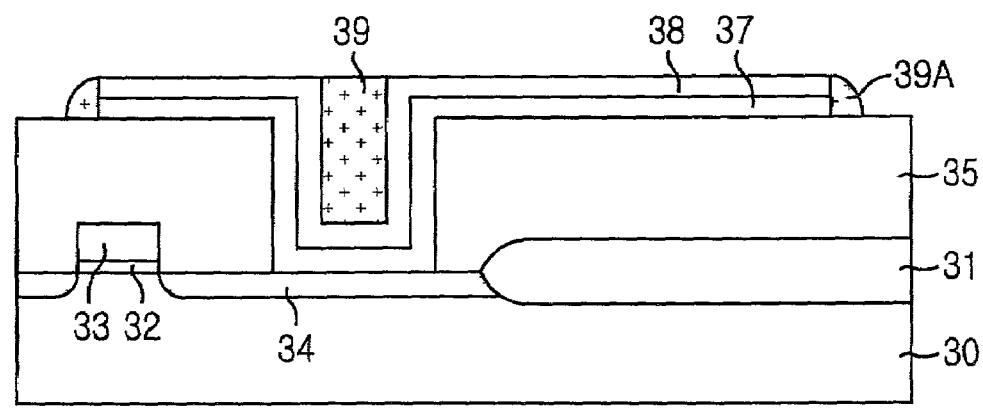

First, referring to FIG. 12A, the first interlayer insulating layer 35, which covers the semiconductor substrate 30, is selectively etched to form the contact hole exposing the source/drain impurity region 34, wherein the silicon semiconductor substrate 30 has the transistor structure including the field oxide layer 31, the gate insulating layer 32, the gate electrode 33 and the source/drain impurity region 34. Then, the metal diffusion barrier layer 37 and the bottom electrode 38 are, in this order, formed on the bottom and sidewalls of the contact hole and around the first interlayer insulating layer 35.

Subsequently, referring to FIG. 12B, the oxygen diffusion barrier layer 39 is formed on the resulting structure and etched by the blanket etching process so that the oxygen diffusion barrier layer spacer 39A is formed on the sidewalls of the metal diffusion barrier layer 37 and the bottom electrode 38, and the oxygen diffusion barrier layer 39 pattern is formed to cover the bottom electrode 38 within the contact hole. The oxygen diffusion barrier layer 39 has the same topology as the bottom electrode 38 over the metal diffusion barrier layer 37 and the interlayer insulating layer 35.

Figure 12C:
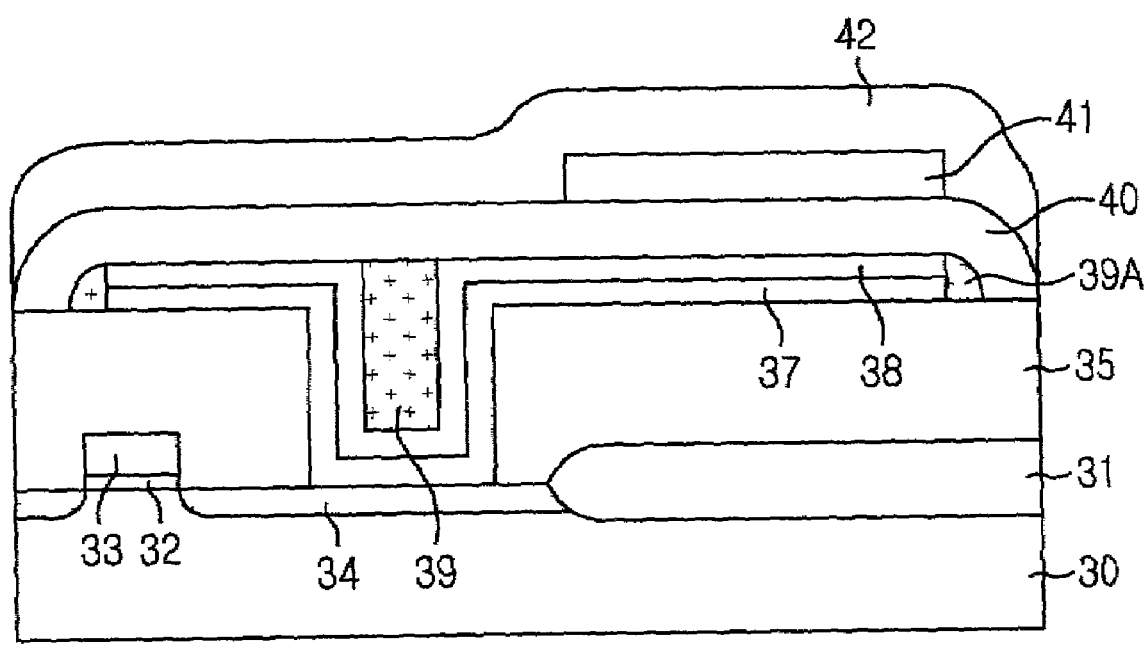

Finally, referring to FIG. 12C, the ferroelectric layer 40 is formed on the bottom electrode 38, the oxygen diffusion barrier layer 39 and the oxygen diffusion barrier layer spacer 39A, the top electrode 41 is formed on the ferroelectric layer 40, and then the second interlayer insulating layer 42 is formed on the resulting structure.

A method for manufacturing the FeRAM device according to the fourth embodiment of the present invention will be described in detail referring to FIGS. 13A to 13C.

Figure 13A:
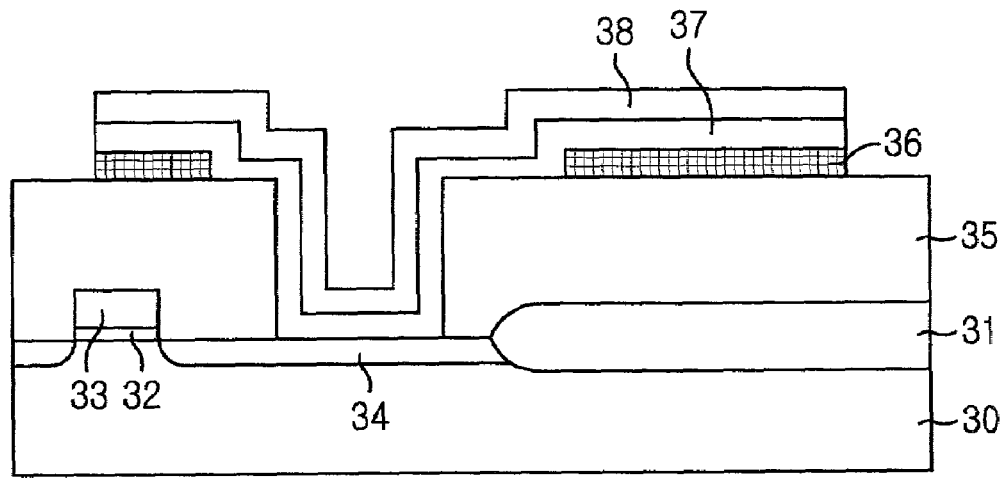
FIGS. 13A to 13C are cross-sectional views showing a FeRAM device manufacturing process in accordance with the fourth embodiment of the present invention.

First, referring to FIG. 13A, the first interlayer insulating layer 35, which covers the semiconductor substrate 30, is selectively etched to form the contact hole exposing the source/drain impurity region 34, wherein the silicon semiconductor substrate 30 has the transistor structure including the field oxide layer 31, the gate insulating layer 32, the gate electrode 33 and the source/drain impurity region 34. The adhesion layer 36 pattern is formed on the first interlayer insulating layer 35, but not in the contact hole. Then, the metal diffusion barrier layer 37 and the bottom electrode 38 are, in this order, formed on the bottom and sidewalls of the contact hole and around the contact hole and over the adhesion layer 36.

Figure 13B:
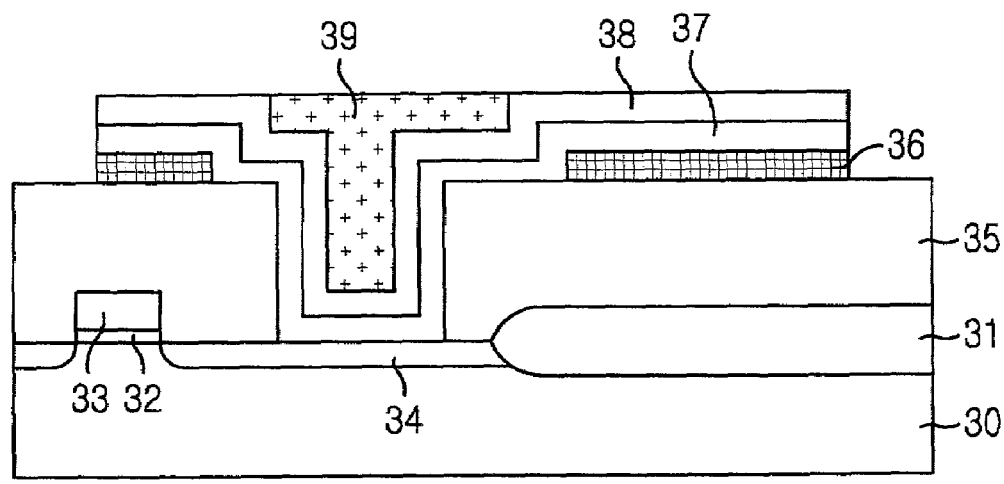

Then, as shown in FIG. 13B, the oxygen diffusion barrier layer 39 is formed on the bottom electrode 38 within the contact hole, filling the contact hole. At this time, the oxygen diffusion barrier layer 39 has the same topology as the bottom electrode 38.

Figure 13C:
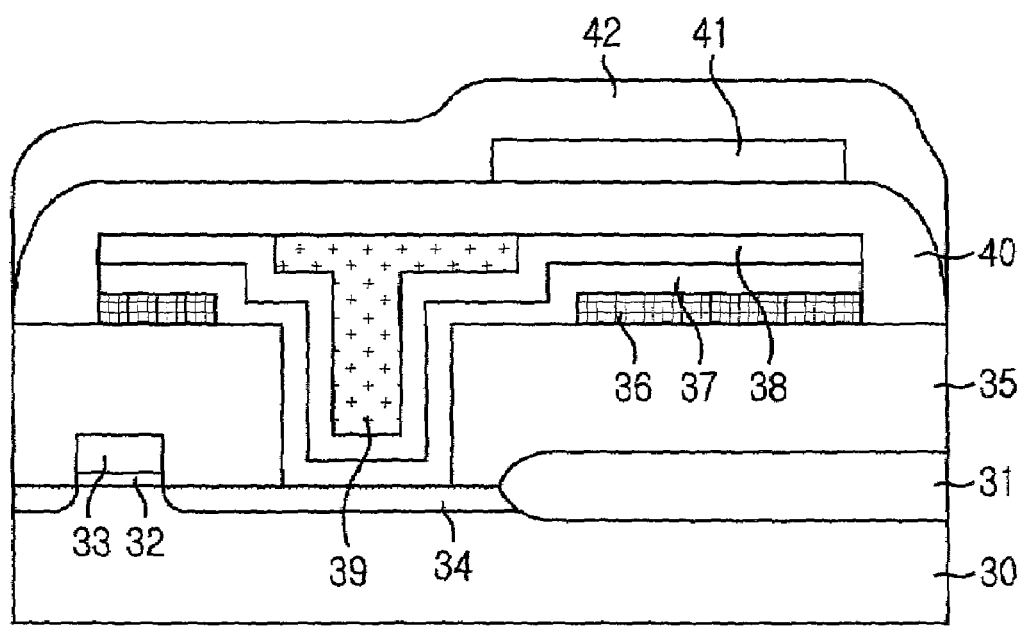

Finally, as described in FIG. 13C, the ferroelectric layer 40 is formed on the bottom electrode 38 and the oxygen diffusion barrier layer 39, the top electrode 41 is formed on the ferroelectric layer 40, and then the second interlayer insulating layer 42 is formed on the resulting structure.

A method for manufacturing the FeRAM device according to the fifth embodiment of the present invention will be described in detail referring to FIGS. 14A to 14C.

Figure 14A:
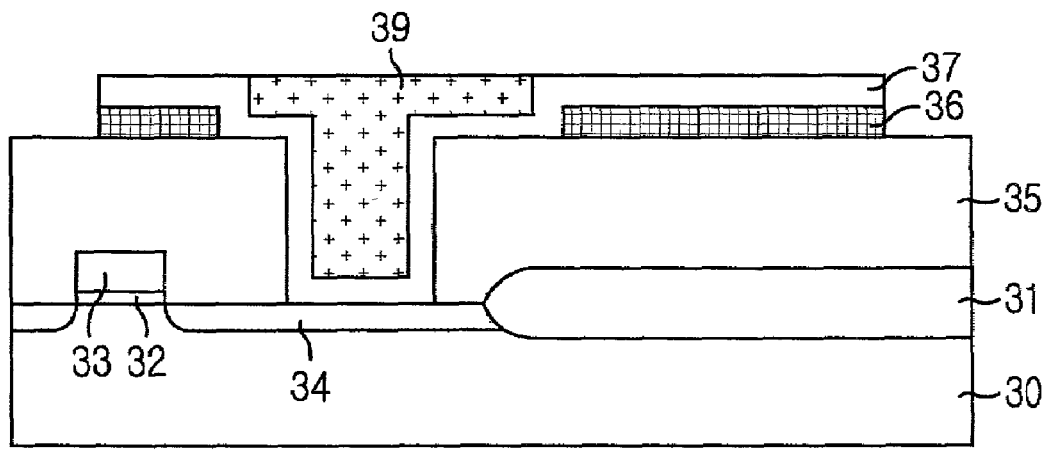
FIGS. 14A to 14C are cross-sectional views showing a FeRAM device manufacturing process in accordance with the fifth embodiment of the present invention.

First, as described in FIG. 14A, the first interlayer insulating layer 35, which covers the semiconductor substrate 30, is selectively etched to form the contact hole exposing the source/drain impurity region 34, wherein the silicon semiconductor substrate 30 has the transistor structure including the field oxide layer 31, the gate insulating layer 32, the gate electrode 33 and the source/drain impurity region 34. The adhesion layer 36 pattern is formed on the first interlayer insulating layer 35 but not in the contact hole. Then, the metal diffusion barrier layer 37 is formed on the bottom and sidewalls of the contact hole and on the first interlayer insulating layer 35 and the adhesion layer 36.

The oxygen diffusion barrier layer 39 is formed on the metal diffusion barrier layer 37 within the contact hole, filling the contact hole. The oxygen diffusion barrier layer 39 has the same topology as the metal diffusion barrier layer 37 on the adhesion layer 36.

Figure 14B:
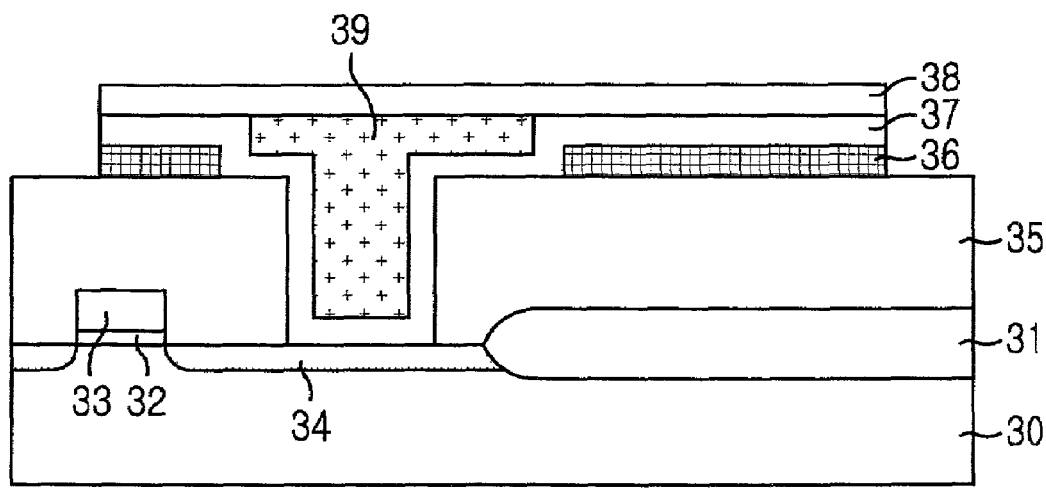

Then, as shown in FIG. 14B, the bottom electrode 38 is formed on the metal diffusion barrier layer 37 and the oxygen diffusion barrier layer 39.

Figure 14C:
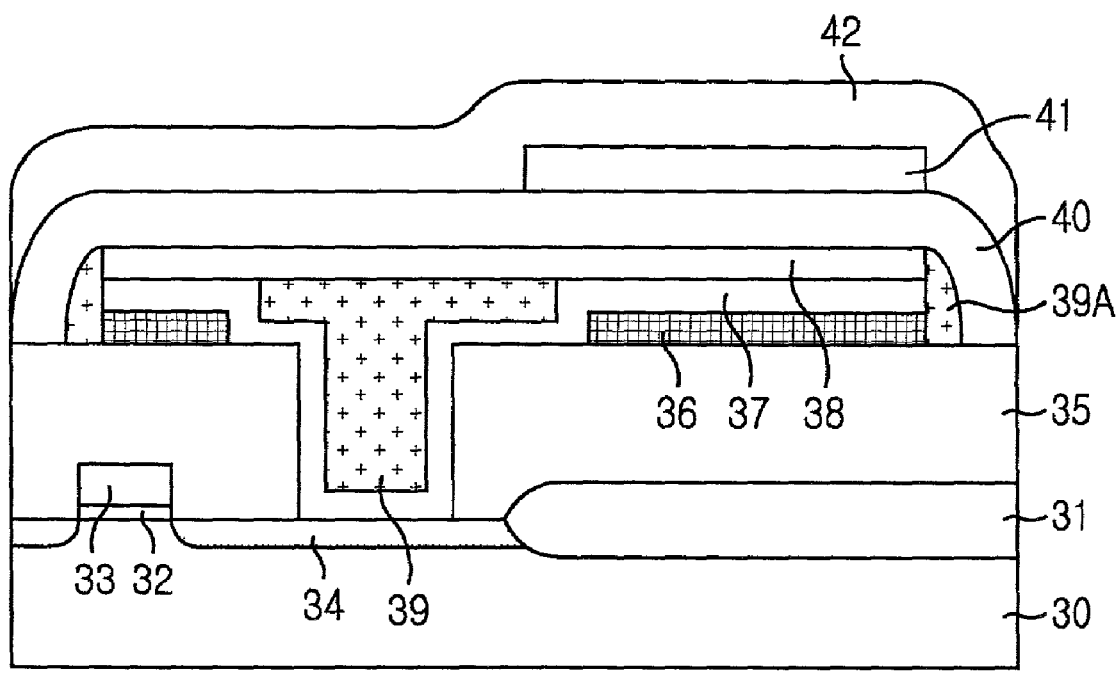

Subsequently, as shown in FIG. 14C, the oxygen diffusion barrier layer spacer 39A is formed on the sidewalls of the bottom electrode 38, the metal diffusion barrier layer 37 and the adhesion layer 36. The ferroelectric layer 40 is formed on the bottom electrode 38 and the oxygen diffusion barrier layer spacer 39A, and the top electrode 41 is formed on the ferroelectric layer 40. Finally, the second interlayer insulating layer 42 is formed on the resulting structure.

A method for manufacturing the FeRAM device according to the sixth embodiment of the present invention will be described in detail referring to FIGS. 15A to 15C.

Figure 15A:
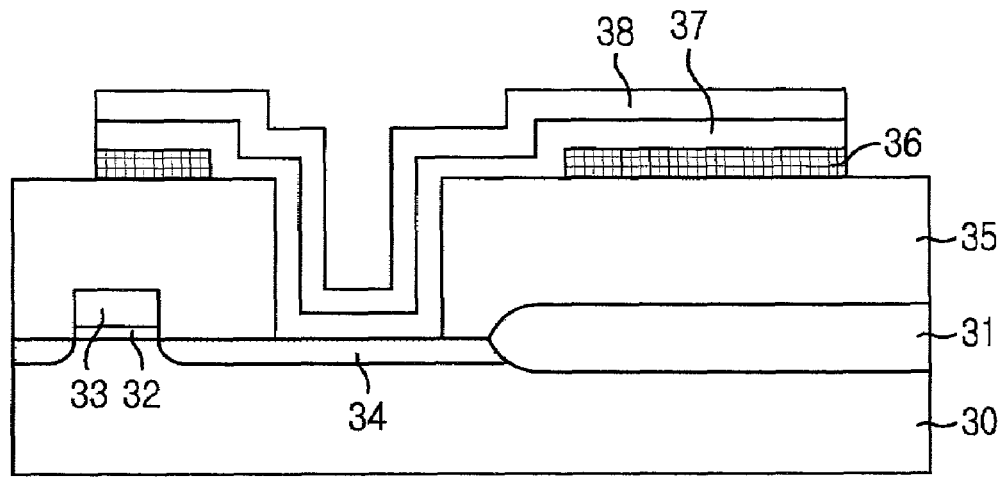
FIGS. 15A to 15C are cross-sectional views showing a FeRAM device manufacturing process in accordance with the sixth embodiment of the present invention.

First, as shown in FIG. 15A, the first interlayer insulating layer 35, which covers the semiconductor substrate 30, is selectively etched to form the contact hole exposing the source/drain impurity region 34, wherein the silicon semiconductor substrate 30 has the transistor structure including the field oxide layer 31, the gate insulating layer 32, the gate electrode 33 and the source/drain impurity region 34. The adhesion layer 36 is formed on the first interlayer insulating layer 35, but not in the contact hole. Then, the metal diffusion barrier layer 37 and the bottom electrode 38 are, in this order, formed on the bottom and sidewalls of the contact hole and on the first interlayer insulating layer 35 and the adhesion layer 36.

Figure 15B:
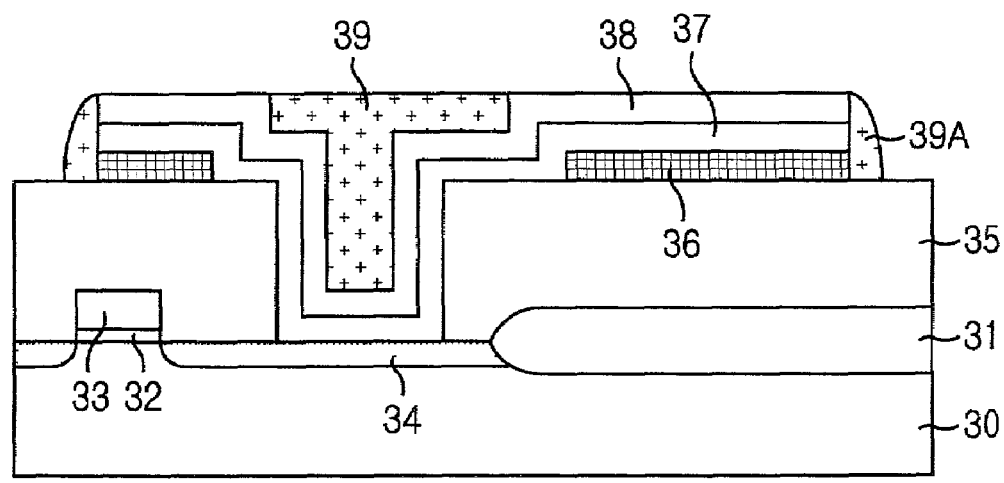

Then, as shown in FIG. 15B, the oxygen diffusion barrier layer 39 is formed on the resulting structure and etched by the blanket etching method so that the oxygen diffusion barrier layer spacer 39A is formed on the sidewalls of the adhesion layer 36, the metal diffusion barrier layer 37 and the bottom electrode 38, while the oxygen diffusion barrier layer 39 is remnant on the bottom electrode 38 within the contact hole.

Figure 15C:
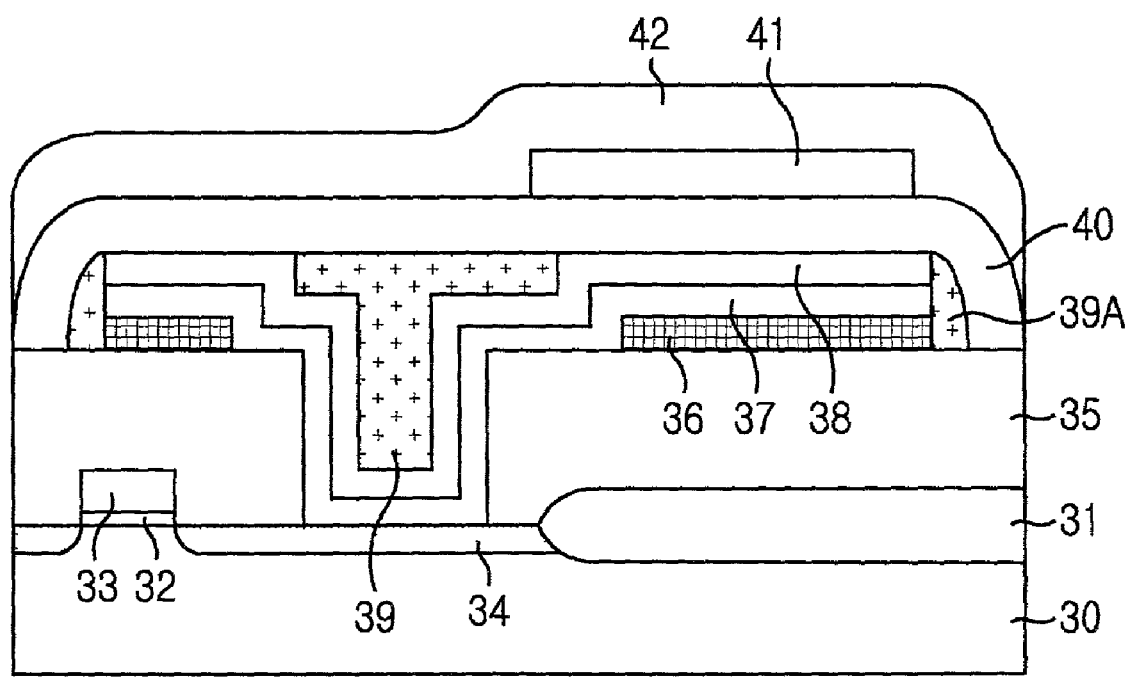

Subsequently, as shown in FIG. 15C, the ferroelectric layer 40, which covers the bottom electrode 38, the oxygen diffusion barrier layer 39 and the oxygen diffusion barrier layer spacer 39A, is formed. Finally, the top electrode 41 is formed on the ferroelectric layer 40 and the second interlayer insulating layer 42 is formed on the resulting structure.

In use of the above methods described for the embodiments in accordance with the present invention, the metal diffusion barrier layer 37 is made stacking up a Ti layer and a TiN layer to prevent the Ti material from being diffused into the ferroelectric layer. A thermal process, using a rapid thermal processing method or a furnace, is carried out after forming the metal diffusion barrier layer 37 to form a Ti silicide layer (not shown) on the semiconductor substrate 30. Each of the bottom electrode 38 and the top electrode 41 is formed from any one selected from the group consisting of Pt, Ir, IrO$_x$, Ru, Re and Rh materials and the ferroelectric layer 40 is formed with a sol-gel method by using the SrBi$_2$O$_9$(SBT) and the Pb(Zr, Ti)O$_3$(PZT). Also, the oxygen diffusion barrier layer 39 is formed with Si$_3$N$_4$ material and the adhesion layer 36 is formed from any one selected from the group consisting of TiO$_x$ layer, IrO$_x$ layer and Al$_2$O$_3$ layer.

The present invention can suppress an oxidation of underlying layers, when the ferroelectric layer is formed, so that a conventional interconnection line, which connects a top electrode to a charge storage node, is not required because a bottom electrode and a top electrode of the ferroelectric capacitor are connected to a charge storage node and a plate line, respectively. With this, the maintenance of a space for preventing a short circuit between a bottom electrode and an interconnection line is not essential and, thereby, cell size may be reduced. Also, the layers may be favorably buried within a contact hole, preventing a topology generated by the interconnection line formation. Also, an exposure and an etching process of a pattern formation may be stably carried out to reduce such a topology of a memory cell area and a periphery circuit area, and a metal bridge can be effectively prevented.

While the present invention has been described with respect to the particular embodiments, it will be apparent to those skilled in the art that various changes and modifications may be made without departing from the scope of the invention as defined in the following claims.

What is claimed is:

1. A memory device, comprising:
a semiconductor substrate;
a gate electrode formed on the semiconductor substrate;
impurity regions formed in the semiconductor substrate adjacent to each side of the gate electrode;
an insulating layer formed on the semiconductor substrate, the gate electrode and the impurity regions;
a contact hole formed in the insulating layer for exposing one of the impurity region;
a bottom electrode, which is connected to one of the impurity regions, formed in the contact hole and on a portion of the insulating layer;
an oxygen diffusion barrier layer formed on the bottom electrode, wherein a portion of the oxygen diffusion barrier layer is buried within the contact hole to fill a remaining portion of the contact hole, wherein oxygen diffusion barrier layer is overlapped with the bottom electrode and the bottom electrode is also overlapped with the impurity region;
a ferroelectric layer formed on and in direct contact with the oxygen diffusion barrier layer and the bottom electrode; and
a top electrode formed on the ferroelectric layer.

2. The memory device of claim 1, further comprising a metal diffusion barrier layer between the impurity region and the bottom electrode.

3. The memory device of claim 2, further comprising an oxygen diffusion barrier layer on sidewalls of the metal diffusion barrier layer and the bottom electrode.

4. A memory device, comprising:
a semiconductor substrate;
a gate electrode formed on the semiconductor substrate;
an impurity region formed in the semiconductor substrate adjacent to a side of the gate electrode;
an insulating layer formed on the semiconductor substrate, the gate electrode and the impurity region;
a contact hole formed in the insulating layer for exposing one of the impurity region;
a metal diffusion barrier layer formed on the impurity region, sidewalls of the contact hole, and a portion of the interlayer insulating layer;
a oxygen diffusion barrier layer formed on the metal diffusion barrier layer within the contact hole to fill a remaining portion of the contact hole, wherein oxygen diffusion barrier layer is overlapped with the bottom electrode and the bottom electrode is also overlapped with the impurity region;
a bottom electrode formed on and in direct contact with the oxygen diffusion barrier layer and the metal diffusion barrier layer;
a ferroelectric layer formed on the bottom electrode; and
a top electrode formed on the ferroelectric layer.

5. The memory device of claim 4, wherein the metal diffusion barrier layer is stacked structure of a Ti layer and a TiN layer.

6. The memory device of claim 5, wherein the ferroelectric layer is selected from the group consisting of SrBi$_2$O$_9$ (SBT) and Pb(Zr, Ti)O$_3$(PZT).

7. The memory device of claim 5, wherein the oxygen diffusion barrier layer is a SiBi$_3$N$_4$ layer.

* * * * *